United States Patent
Brochhaus

(10) Patent No.: US 10,131,244 B2
(45) Date of Patent: Nov. 20, 2018

(54) METHOD FOR MONITORING A BATTERY

(71) Applicant: Robert Bosch GmbH, Stuttgart (DE)

(72) Inventor: Christoph Brochhaus, Aachen (DE)

(73) Assignee: Robert Bosch GmbH, Stuttgart (DE)

( * ) Notice: Subject to any disclaimer, the term of this patent is extended or adjusted under 35 U.S.C. 154(b) by 149 days.

(21) Appl. No.: 15/112,216

(22) PCT Filed: Jan. 2, 2015

(86) PCT No.: PCT/EP2015/050009
§ 371 (c)(1),
(2) Date: Jul. 18, 2016

(87) PCT Pub. No.: WO2015/106974
PCT Pub. Date: Jul. 23, 2015

(65) Prior Publication Data
US 2016/0339794 A1 Nov. 24, 2016

(30) Foreign Application Priority Data
Jan. 16, 2014 (DE) .................. 10 2014 200 673

(51) Int. Cl.
*B60L 11/18* (2006.01)
*H01M 10/42* (2006.01)
(Continued)

(52) U.S. Cl.
CPC ............. *B60L 11/1851* (2013.01); *B60L 3/12* (2013.01); *B60L 11/1853* (2013.01);
(Continued)

(58) Field of Classification Search
CPC .... B60L 11/1851; B60L 3/12; B60L 11/1853; B60L 2240/545; B60L 2240/547;
(Continued)

(56) References Cited

U.S. PATENT DOCUMENTS

2010/0106351 A1 4/2010 Hanssen et al.
2011/0187378 A1 8/2011 Boehm et al.
(Continued)

FOREIGN PATENT DOCUMENTS

DE 102008041103 2/2010
DE 102009036083 2/2011
(Continued)

OTHER PUBLICATIONS

International Search Report for Application No. PCT/EP2015/050009 dated Mar. 20, 2015 (English Translation, 2 pages).

*Primary Examiner* — Melissa Koval
*Assistant Examiner* — Courtney McDonnough
(74) *Attorney, Agent, or Firm* — Michael Best & Friedrich LLP

(57) ABSTRACT

The invention relates to a method for monitoring a battery (16) in a vehicle (10). The battery (16) comprises multiple battery cells (19) or multiple groups (20) of battery cells (19). The method has the following steps: a) detecting a time curve of an operating parameter of at least one individual battery cell (19) during a driving cycle, b) ascertaining charging processes and discharging processes in the detected time curve of the operating parameter, c) ascertaining a use parameter set which comprises functions that characterize the individual charging processes and discharging processes and the functional parameters thereof, the ascertained charging processes and discharging processes being reconstructed using said characterizing functions and functional parameters, and d) storing the ascertained use parameter set in a non-volatile storage unit (32). The invention additionally relates to a computer program, to a battery system (12) which is designed to carry out the method, and to a vehicle (10) with such a battery system (12).

13 Claims, 4 Drawing Sheets

(51) Int. Cl.
*H01M 10/48* (2006.01)
*B60L 3/12* (2006.01)
*G01R 31/00* (2006.01)
*H02J 7/00* (2006.01)
*G01R 31/36* (2006.01)
*H01M 10/44* (2006.01)

(52) U.S. Cl.
CPC ......... *G01R 31/00* (2013.01); *G01R 31/3658* (2013.01); *H01M 10/425* (2013.01); *H01M 10/44* (2013.01); *H01M 10/482* (2013.01); *H02J 7/00* (2013.01); *B60L 2240/545* (2013.01); *B60L 2240/547* (2013.01); *B60L 2240/549* (2013.01); *H01M 2010/4271* (2013.01); *H01M 2220/20* (2013.01); *H02J 7/0021* (2013.01); *Y02T 10/7005* (2013.01); *Y02T 10/705* (2013.01); *Y02T 10/7055* (2013.01)

(58) Field of Classification Search
CPC ............. B60L 2240/549; H01M 10/44; H01M 10/482; H01M 10/425; H01M 2220/20; H01M 2010/4271; G01R 31/3658; G01R 31/00; H02J 7/00; H02J 7/0021; Y02T 10/7005
USPC ....................................................... 324/434
See application file for complete search history.

(56) References Cited

U.S. PATENT DOCUMENTS

| | | |
|---|---|---|
| 2012/0116699 A1 | 5/2012 | Haag et al. |
| 2012/0266431 A1 | 10/2012 | Hahn et al. |
| 2012/0290236 A1* | 11/2012 | Majima ................ G01R 31/362 702/63 |
| 2014/0180514 A1 | 6/2014 | Becker et al. |

FOREIGN PATENT DOCUMENTS

| | | |
|---|---|---|
| DE | 102012224060 | 6/2014 |
| EP | 2485293 | 8/2012 |
| EP | 2503665 | 9/2012 |

* cited by examiner $f(x)=0.01*(-x^2)+3.5$ ( $c_1=0.01$, $c_2=0$, $b=3.5$ )

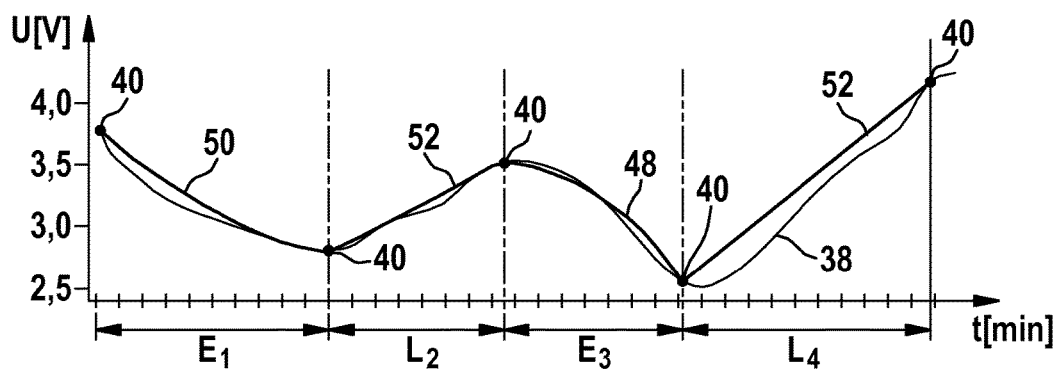
Fig. 4
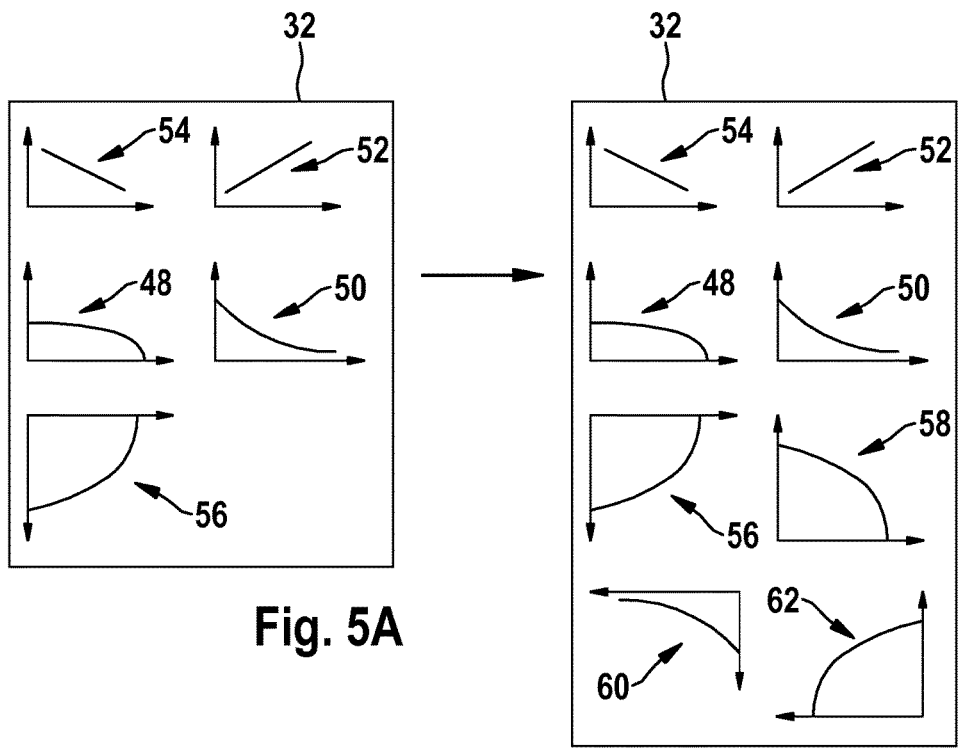
Fig. 5A
Fig. 5B

METHOD FOR MONITORING A BATTERY

BACKGROUND OF THE INVENTION

The method relates to a method for monitoring a battery in a vehicle, which comprises multiple battery cells. The method further relates to a computer program, a battery system and a vehicle which are equipped to carry out the method.

Electronic control devices are increasingly used today in the automotive field, for example for the motor management system, the antilock braking system (ABS) or the airbag. The design and development of batteries which comprise a plurality of battery cells consolidated in battery modules and of the associated battery management system is essential for electrically driven vehicles. In this context, the battery management system comprises a control device with software for monitoring and controlling the battery functionality.

Depending on the requirements and the available installation space, the topologies of the battery are very diverse with regard to the number of battery cells, battery modules and sensors. In the European patent publication EP 2 503 665 A1, a voltage supply system comprising an electrical storage unit is, for example, described. During operation of the electrical storage unit, said unit is charged or, respectively, discharged, wherein the profile of a cell voltage follows a charging or, respectively, discharging curve.

Typical battery management systems ensure a safe and reliable performance of the battery. Said systems monitor and control currents, voltages, temperatures, insulation resistances and other operating parameters which characterize the condition of the battery cells, the battery modules and therefore the battery. With the aid of the operating parameters, management functions can be implemented which increase the service life, the reliability and the safety of the battery.

The German patent specification DE 10 2009 036 083 A1 describes a method for controlling operating states of a battery on the basis of an assessment which is obtained with the aid of approximation functions. In so doing, the assessment consists of ageing curves which were obtained by measuring first operating states. By interpolating between these measured values, assessments are then obtained for second operating states. The approximation functions are functions of the operating state variables and further parameters, wherein the parameter values are stored in a storage unit.

In the prior art, different options are known for storing data in a battery system. In the German patent specification DE 10 2008 041 103 A1, a detection device is described for determining a state of charge of an electrical storage unit in the motor vehicle. The state of charge is thereby determined using a characteristic curve which describes an electrical loading of storage cells as a function of the individual cell voltage. The characteristic curve for ascertaining the load capacity of the battery is stored in a data storage unit.

A battery system which comprises multiple battery cells in battery modules is known from the European patent specification EP 2 485 293 A1. The battery system further comprises integrated circuits which, inter alia, carry out a diagnosis of the cells of the battery modules. The battery system further comprises a non-volatile storage unit, in which data regarding the usage behavior of the battery modules including the maximum voltage or the maximum current of the battery modules and a history of the battery modules are stored. In addition, such stored usage information can describe the extent of the use in which certain standards were exceeded. The maximum and the minimum supply voltage can also be stored. In addition, the maximum load current and the maximum charging current can further be stored.

It is important for reasons of safety and reliability that a history of the use of the battery is kept. This comprises, for example, usage information about the battery in certain temperature ranges at certain voltages. Within the scope of warranty claims, stored usage information can be read from a non-volatile storage unit of the control device and can be used to evaluate the use of the battery. Thus, detailed information about the use of the battery is available during the service life thereof.

In order to also retrospectively reconstruct the use of the battery, i.e., for example, in the event of failure of the battery, it is necessary to deposit operating parameters of said battery in a non-volatile storage unit. Over the service life of a battery, so many operating parameters are however accumulated that the storage capacity is quickly exceeded. For that reason, there is a continuing interest for structuring the storage of operating parameters as efficiently and sustainably as possible; so that, on the one hand, the storage capacity is not overloaded and, on the other hand, the use of the battery can be reconstructed over the service life thereof.

SUMMARY OF THE INVENTION

The invention relates to a method for monitoring a battery in a vehicle, wherein the battery comprises multiple battery cells or multiple groups of battery cells. The method comprises the following steps:

a) detecting a time curve of an operating parameter of at least one individual battery cell during a driving cycle, b) ascertaining charging processes and discharging processes in the detected time curve of the operating parameter, c) ascertaining a use parameter set which comprises functions that characterize the individual charging processes and discharging processes and the functional parameters thereof, the ascertained charging and discharging processes being reconstructed using said characterizing functions and functional parameters, and d) storing the ascertained use parameter set in a non-volatile storage unit.

Use parameters particularly denote such parameters which characterize the charging and discharging processes. The use parameter set is particularly selected in such a way that storage requirements for said use parameter set are minimal.

A driving cycle denotes a period of time between starting the vehicle from an inactive state and the subsequent renewed transfer of the vehicle into the inactive state. An inactive state is achieved if the battery is neither charged nor discharged for an electrical drive of the vehicle. The driving cycle can comprise operating phases of the vehicle, which have charging processes and discharging processes of the battery. The use parameter set can be ascertained during or at the end of the driving cycle. The time curve of the operating parameter can thereby be stored in a volatile storage unit or temporarily in the non-volatile storage unit.

The vehicle can be embodied as a pure electric vehicle and exclusively comprise an electric drive system. The vehicle can alternatively be embodied as a hybrid vehicle which comprises an electric drive system and an internal combustion engine. In so doing, the battery of the hybrid vehicle can be charged internally via a generator with excess energy from the internal combustion engine. Externally rechargeable hybrid vehicles (plug-in hybrid electric vehicle, PH EV) provide additionally the option of charging the battery via the external power grid. In vehicles of such design, the driving cycle comprises a driving operation and/or a charging operation as operating phases, in which operating parameters can be detected.

During the driving cycle, at least one operating parameter of an individual battery cell or a group of battery cells—also referred to as battery module—can be detected by means of sensor units. Such sensor units can be implemented as a cell monitoring circuit at the output of the battery cells or as module monitoring units at the output of groups of battery cells or battery modules. In addition, such sensor units can detect a voltage, a current, a resistance, an output, a temperature or other operating parameters known to the person skilled in the art of individual battery cells or individual battery modules. The voltage is particularly detected to ascertain charging processes and discharging processes. The voltage can thereby relate to the voltage of individual battery cells, i.e. the cell voltage, or to the voltage of individual battery modules, i.e. the module voltage.

In order to detect the time curve of the operating parameter, the sensor units continuously monitor individual battery cells or individual battery modules and provide the corresponding data to a control unit, in which a battery management system is implemented. Data can, for example, be exchanged between the sensor units and the control device via a bus, for instance via a SPI bus (serial peripheral interface bus) or a CAN bus (controller area network bus). In this case, continuously refers to the fact that operating parameters are detected by the sensor units and transmitted to the control device comprising the battery management system according to defined time intervals or with a defined scanning rate, for example every minute. In order to detect the time curve of the operating parameter, the detected operating parameters are particularly stored in a volatile storage unit, such as a RAM memory (random access memory). The defined time interval or the defined scanning rate can be adapted to the frequency of the changes in the operating parameter, wherein a lower limit is provided by means of the data transmission rate of the bus between the sensor units and the control device.

Characteristic functions denote such linear and non-linear functions which approximate the curve of the charging processes and discharging processes. The functional parameters of the characteristic functions can therefore be adapted in such a way that the characteristic functions substantially correspond to the time curve of individual charging processes and discharging processes. Substantially refers here to deviations of the characteristic function from the actually detected time curve of individual charging processes and discharging processes, which lie within the scope of the uncertainties of a function adaptation or a fit.

In one embodiment, one or a plurality of characteristic functions is predefined. Thus, one or a plurality of characteristic functions can be deposited in a non-volatile storage unit. In order to ascertain the use parameter set, the predefined characteristic functions can be adapted to the time curve of individual charging processes and discharging processes with the aid of functional parameters, and the characteristic function comprising the functional parameters can be selected which has the smallest deviations from the actually detected time curve of an individual charging process or discharging process. Hence, the characteristic function comprising functional parameters is selected which best approximates the actually detected time curve of the individual charging process or discharging process.

In a further embodiment, the characteristic functions comprise polynomials up to a sixth order, preferably up to a fourth order and in a particularly preferred manner up to a third order. In this way, the characteristic functions can comprise a constant, a linear, a quadratic, a cubic, a quartic or biquadratic, a quantic and/or or sextic function. Examples of characteristic functions which approximate charging processes and discharging processes are $f_1(x)=\pm a \cdot x \pm b$, $f_2(x)=\pm c_1 \cdot (c_2 \pm x)^2 \pm a \cdot x \pm b$ and $f_3(x)=\pm d_1 \cdot (d_2 \pm x)^3 \pm c_1 \cdot (c_2 \pm x)^2 \pm a \cdot x \pm b$, wherein a, b, $c_1$, $c_2$, $d_1$, $d_2$, $e_1$ and $e_2$ denote constants which are ascertained within the scope of the function adaptation or the fit. The constants a, b, $c_1$, $c_2$, $d_1$, $d_2$, $e_1$ and $e_2$ are positive real numbers and thus denote functional parameters, which are stored as use parameters having that characteristic function which, therefore best, approximates the discharging process or the charging process in comparison to other characteristic functions with the slightest deviations. A discharging process has, for example, a polynomial curve with a negative slope. This can be approximated particularly with the aid of the characteristic functions: $f(x)=-a \cdot x$, $f(x)=\pm c_1 \cdot (c_2-x)^2 \pm b$ or $f(x)=\pm d_1 \cdot (d_2-x)^3 \pm h$. A charging process analogously has, for example, a polynomial curve with a positive slope. This can be approximated particularly with the aid of the characteristic functions: $f(x)=a \cdot x$, $f(x)=\pm c_1 \cdot (c_2-x)^2 \pm b$ or $f(x)=\pm d_1 \cdot (d_2-x)^3 \pm h$.

In a further embodiment, the number of characteristic functions which are predefined and are, in particular, deposited in the non-volatile storage unit is increased or reduced on the basis of time curves previously detected, for example from previous driving cycles. Further characteristic functions can thus be predefined if the time curve changes as a function of an ageing condition. Such characteristic functions which do not describe the individual charging processes or discharging processes with sufficient accuracy can be deleted. The required accuracy is thereby determined from the deviation of an individual characteristic function, which is adapted to charging processes or discharging processes, in comparison to other characteristic functions which are adapted to charging processes or discharging processes. If the deviation for say one of the characteristic function is continually worse than for others, said characteristic function is not used and can therefore be deleted from the non-volatile storage unit.

The charging processes and the discharging processes can be ascertained with the aid of a slope profile in the time curve of the operating parameter. A charging process is thus indicated if the time curve of the operating parameter, in particular the voltage, has a positive slope. A discharging process is indicated if the time curve of the operating parameter, in particular the voltage, has a negative slope. In order to identify the charging and discharging processes in the time curve, the extreme points in the time curve of the operating parameter, in particular the voltage, can initially be ascertained. On the basis of the extreme points, a starting point, an end point and/or a duration of the charging processes and discharging processes can be ascertained.

In a further embodiment, the use parameters additionally comprise extreme points of individual charging processes and discharging processes, from which the starting point in time, the end point in time and the duration of the individual charging processes or discharging processes can be reconstructed.

In a preferred manner, the use parameter set comprises the predefined characteristic function, functional parameters of the characteristic function, the ascertained extreme points of individual charging processes or discharging processes and if applicable values of such operating parameters which lie outside of a specification of the battery cells or the group of battery cells. In so doing, the starting point in time, the end point in time and the duration of individual charging processes or discharging processes can be reconstructed with the aid of the extreme points. In an especially preferred manner, the use parameter set exclusively consists of the predefined characteristic function, functional parameters of the characteristic function, the ascertained extreme points of individual charging processes or discharging processes and if applicable values of such operating parameters which lie outside a specification of the battery cells or the group of battery cells for individual charging processes or discharging processes.

In a further embodiment, the use parameter set is stored for each charging process or discharging process during the service life of the battery.

In a further embodiment, a time curve of the operating parameter, in particular the voltage, is reconstructed from the stored use parameters in an additional step. The time curve can be reconstructed after a driving cycle and/or at the end of the service life of the battery.

In a further embodiment, the reconstructed curve of the battery parameter is evaluated in relation to a usage behavior. A misuse of the battery can thus, for example, be ascertained. Defects of individual battery cells or individual battery modules can additionally or alternatively be ascertained.

The invention further relates to a computer program carried out according to one of the methods described in the present application if the computer program is executed on programmable computer equipment. The computer program can, for example, relate to a software module, a software routine or a software subroutine for implementing a battery management system in a control device of a vehicle. The computer program can be stored on a machine-readable storage medium, for instance on a permanent or rewritable storage medium, or in association with computer equipment, for example on a portable storage unit, such as a CD-ROM, a DVD, a Blu-ray disc a USB flash drive or a memory card. In addition or as an alternative thereto, the computer program can be provided on computer equipment, such as, for instance, a server or a cloud server for downloading, for example, via a data network tool, such as the internet or a communication connection like a telephone line or a wireless connection.

The invention further relates to a battery system for monitoring a battery of a vehicle, said battery comprising multiple battery cells, wherein the battery comprises multiple battery cells or multiple groups of battery cells. The battery system thus comprises the following components:

a. a sensor unit for detecting a time curve of an operating parameter of at least one individual battery cell during a driving cycle, b. a unit for ascertaining charging processes and discharging processes in the detected time curve of the operating parameter, c. a unit for ascertaining a use parameter set, which comprises functions characteristic for the individual charging processes and discharging processes and the functional parameters thereof, the ascertained charging processes and discharging processes being reconstructed using said characterizing functions and functional parameters, and d. a non-volatile storage unit for storing the ascertained use parameter set.

The battery system is preferably designed and/or equipped to carry out the methods described herein. Accordingly, features described within the scope of the method correspondingly apply to the battery system and vice versa features described within the scope of the battery system correspondingly apply to the method. The battery of the battery system can be embodied as a lithium-ion battery or as a nickel-metal hybrid battery. The battery system can furthermore be able to be connected to a drive train of a vehicle.

The components of the battery system are to be seen as functional units, which are not necessarily physically separated from one another. Thus, multiple components of the battery system can be implemented in a single physical unit, such as if multiple functions in software are implemented in a control device. In addition, the functions of the components can be implemented in hardware, for example by means of sensor units or storage units. In a preferred manner, particularly the components b. and c. of the battery system are implemented as software in the battery management system in a control device.

The storage unit for storing the usage data can be a non-volatile storage unit, for example a EEPROM (electrically erasable programmable read-only memory) of the control unit. The detected time curve is preferably stored in a volatile storage unit, for example a RAM memory (random access memory) of the control unit.

The invention further relates to a vehicle comprising the battery system described in the present application. The vehicle is preferably an electrically driven vehicle, such as a hybrid vehicle or an electric vehicle, which is driven at least in part by electrical energy of a battery comprising multiple battery cells. To this end, the battery system is particularly connected to the drive system of the vehicle.

The invention makes it possible for the use parameters of the battery to be efficiently stored over the service life thereof because the memory requirements are kept low in the non-volatile storage unit. By storing the characteristic behavior of the battery with the help of the use parameters instead of complete time curves, more charging and discharging processes of the battery can be stored over the service life thereof when the memory space is limited. Thus, only the significant values in the form of use parameters can be stored and the limited storage capacity of non-volatile storage units no longer constitutes a limitation. It is also furthermore possible to reconstruct the usage of the battery with the aid of the use parameters and to read out and evaluate use parameters particularly in the case of warranty claims and for long-term studies.

By storing characteristic functions and the functional parameters thereof, a detailed reconstruction is possible despite the low storage requirements. As a result, a detailed evaluation of the reconstructed behavior and therefore of the use behavior is possible over the service life of the battery. In the process, multiple characteristic functions can be predefined and those which best approximate the actual behavior are selected. As a result, the accuracy of the approximation by characteristic functions with respect to the actual behavior of the battery is increased while the storage requirements remain the same.

The subsequent enhancement of the predefined characteristic functions can furthermore increase the accuracy of the approximation. Such subsequent enhancements can, for example, take into account deviations caused by ageing or use after or during the service life of the battery as well as new knowledge about battery systems. In addition, such an enhancement of the characteristic curves can be easily implemented within the scope of maintenance checks of the vehicle at the dealer via software updates.

BRIEF DESCRIPTION OF THE DRAWINGS

Exemplary embodiments of the invention are depicted in the drawings and explained in greater detail in the following description.

In the drawings:

FIG. 4 shows an exemplary time curve of a cell voltage during a driving cycle, which is divided up into charging processes and discharging processes and is approximated by characteristic functions; and FIGS. 5A and 5B show an exemplary set of characteristic functions which are deposited in a non-volatile storage unit, and an exemplary enhancement of the set of characteristic functions.

In the following description of the exemplary embodiments of the invention, identical or similar components are denoted with identical or similar reference signs, wherein a repeated description of said components is dispensed with in individual cases. The drawings only schematically represent the subject matter of the invention.

DETAILED DESCRIPTION

Figure 1:
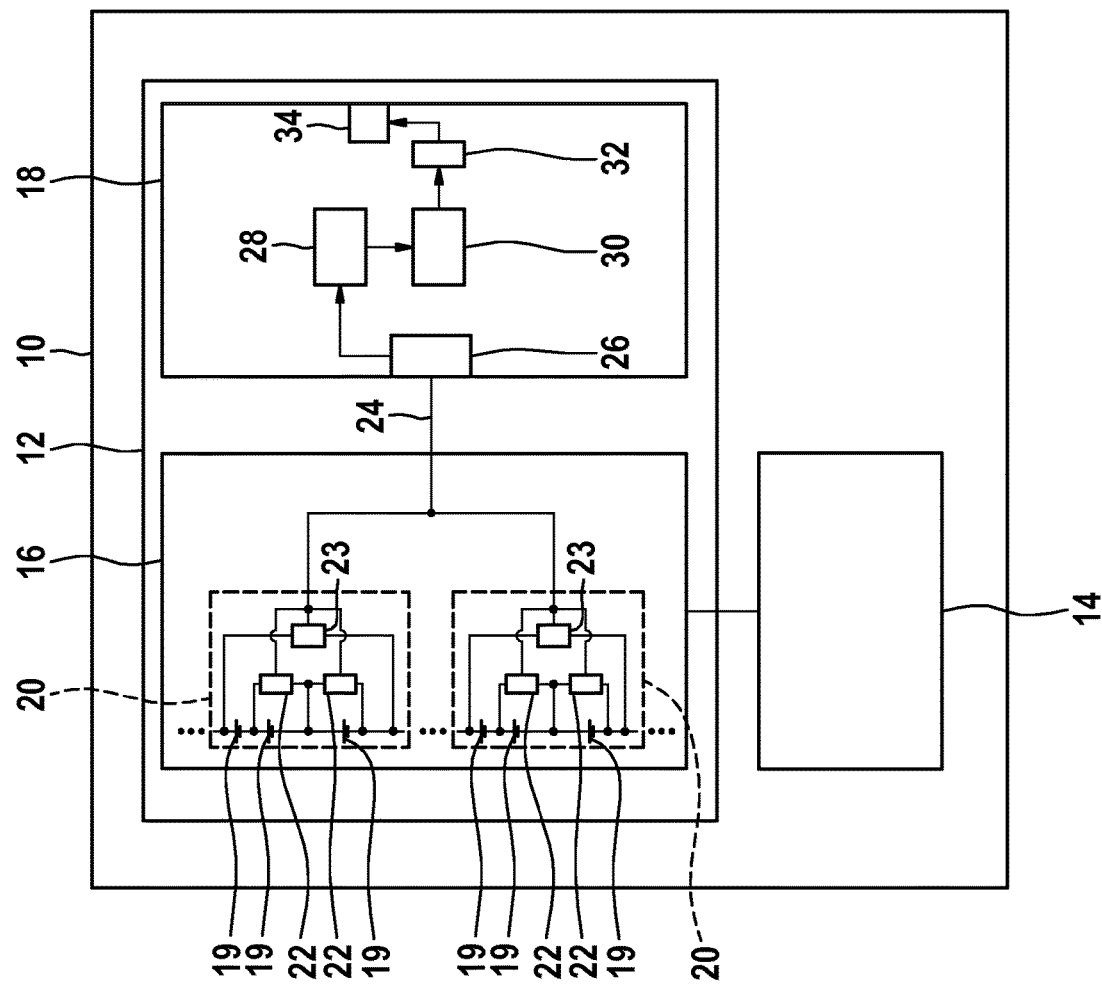
FIG. 1 shows an at least partially electrically driven vehicle comprising a battery system.

FIG. 1 shows an at least partially electrically driven vehicle 10 comprising a battery system 12.

The vehicle of FIG. 1 can be embodied as a purely electrically driven vehicle or as a hybrid vehicle, which additionally has an internal combustion engine. To this end, the vehicle 10 is equipped with an electrical drive system 14, which at least in part electrically drives the vehicle by means of an electric motor (not depicted). The electrical energy is provided by the battery system 12, which comprises a battery 16 and a battery management system 18.

The battery 16 comprises multiple battery cells 19 or accumulator cells, for example lithium-ion cells with a voltage range of 2.8 to 4.2 volts. The battery cells 19 are consolidated in groups into battery modules 20. In order to monitor individual battery cells 19 or battery modules 20, said cells or modules are equipped with cell monitoring units 22 or module monitoring units 23, which detect a voltage, a current or a temperature of individual battery cells 19 or individual battery modules 20 and provide the detected operating parameters to the battery management system 18. The operating parameters can, for example, be transmitted via a bus 24, such as an SPI bus (serial peripheral interface bus) or a CAN bus (controller area network bus) from the cell monitoring units or the module monitoring units 23 to the battery management system 18. The operating parameters are continuously detected at a defined scanning rate of the cell monitoring units 22 or the module monitoring units 23 and transferred to the battery management system 18 such that a time curve 38 of the operating parameters is provided to said battery management system 18. The time curve 38 will be discussed in greater detail in connection with FIG. 2.

The battery management system 18 implements functions for controlling and monitoring the battery 16. Thus, the battery management system 18 comprises a unit 26 for receiving the battery parameters which are detected by the cell monitoring units 22 or the module monitoring units 23. The unit 26 for receiving the operating parameters has a volatile memory, such as a RAM memory, in which the detected operating parameters for different points in time are temporarily stored. In so doing, the operating parameters continuously detected and received at different points in time form the time curve 38 of the operating parameter which is supplied to a unit 28 for ascertaining charging processes and discharging processes. The ascertained charging processes and discharging processes are further supplied to a unit 30 for ascertaining a use parameter set. The use parameter set comprises functional parameters of characteristic functions for the individual charging processes and discharging processes. The ascertained charging processes and discharging processes can be reconstructed with the aid of said functional parameters of characteristic functions. The use parameters are also described in greater detail in connection with the figures discussed below. Finally, the ascertained use parameters are stored in a storage unit 32. In order to reconstruct the time curves 38, the use parameters can be read out from the storage unit 32 via an interface 34.

The method for ascertaining charging processes and discharging processes and for ascertaining the use parameters which characterize the time curve 38 of the ascertained charging processes and discharging processes is explained in greater detail below using an example of a measured time curve 38 for a cell voltage U.

Figure 2:
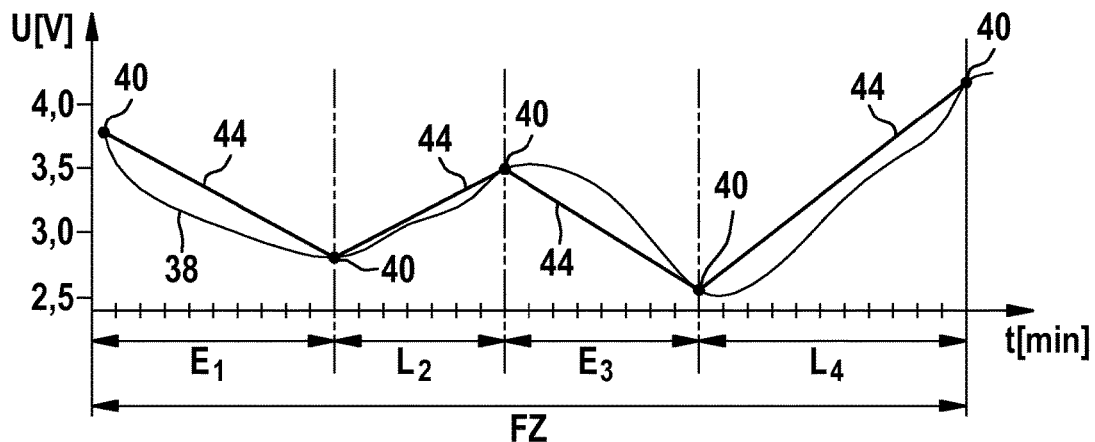
FIG. 2 shows an exemplary time curve of a cell voltage during a driving cycle, said curve being divided up into charging processes and discharging processes.

FIG. 2 shows an exemplary time curve 38 of a cell voltage U during a driving cycle FZ, which is divided up into charging processes and discharging processes.

In FIG. 2, the time curve 38 of the cell voltage U is plotted in volts (V) versus the time t in minutes (min) for a lithium-ion cell as a battery cell 19. The time curve 38 of the cell voltage U fluctuates between approximately 2.5 and 4.5 V. The cell voltage U thus decreases in a first time interval E1 and increases in a following second time interval L2. This process is repeated in a third time interval E3 in which the cell voltage U decreases. The cell voltage U increases again in a fourth time interval L4. The driving cycle FZ is thereby divided up into different time intervals E1, L2, E3, L4 which thereby in each case denote a driving operation or a charging operation and hence a discharging operation in the corresponding time interval E1, E3 or a charging operation in the corresponding time interval L2, L4.

Extreme points 40 are furthermore indicated which delimit the individual time intervals E1, L2, E3, L4. The extreme point denotes the point at which the time curve 38 of the cell voltage U changes the sign of the slope thereof. A total of five extreme points accordingly result in the time curve 38 of the cell voltage U for the driving cycle FZ, which is shown by way of example. These extreme points 40 thereby indicate the transition from a discharging process to a charging process or, respectively, from a charging process to a discharging process and delimit the individual time intervals E1, L2, E3, L4. The lines 44 which connect the extreme points 40 characterize the type of process, depending on the slope of the time curve 38 between the extreme points 40, i.e. a charging process or a discharging process. The duration, the starting point and the end point of the discharging processes and the charging processes can furthermore be ascertained from the extreme points 40. The extreme points 40 are stored as use parameters.

Figure 3A:
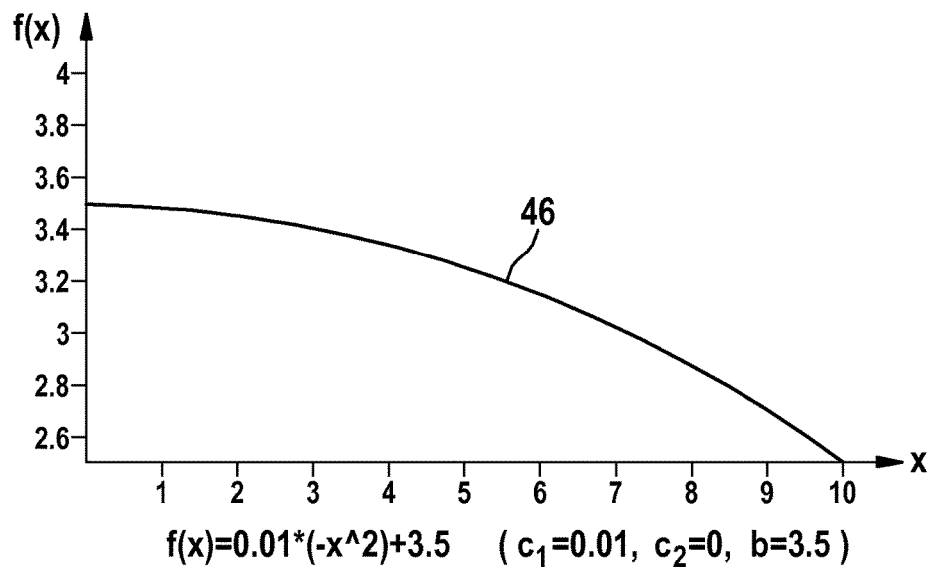
FIGS. 3A, 3B and 3C show exemplary characteristic functions which approximate a discharging process.
Figure 3B:
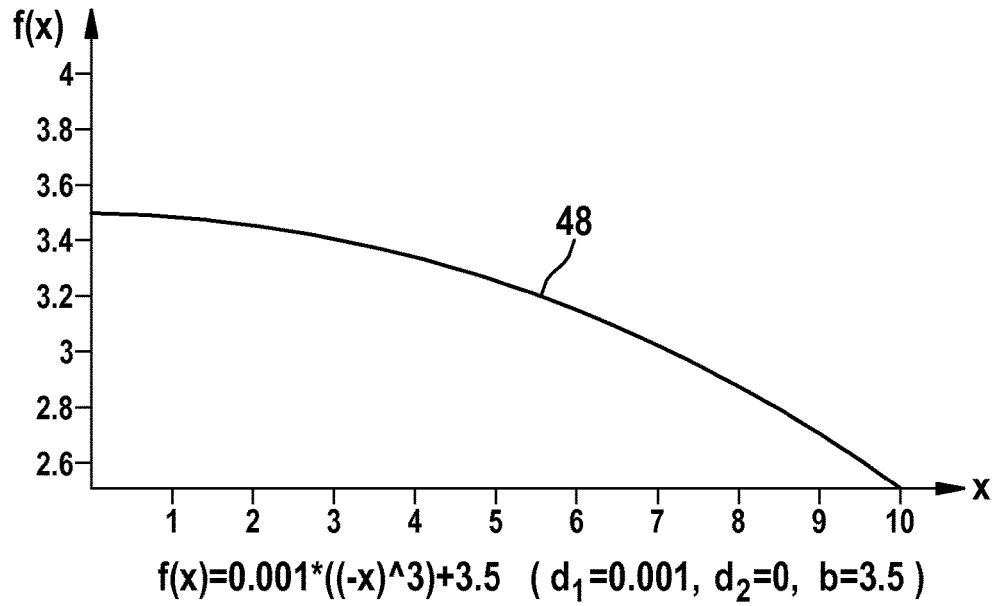
Figure 3C:
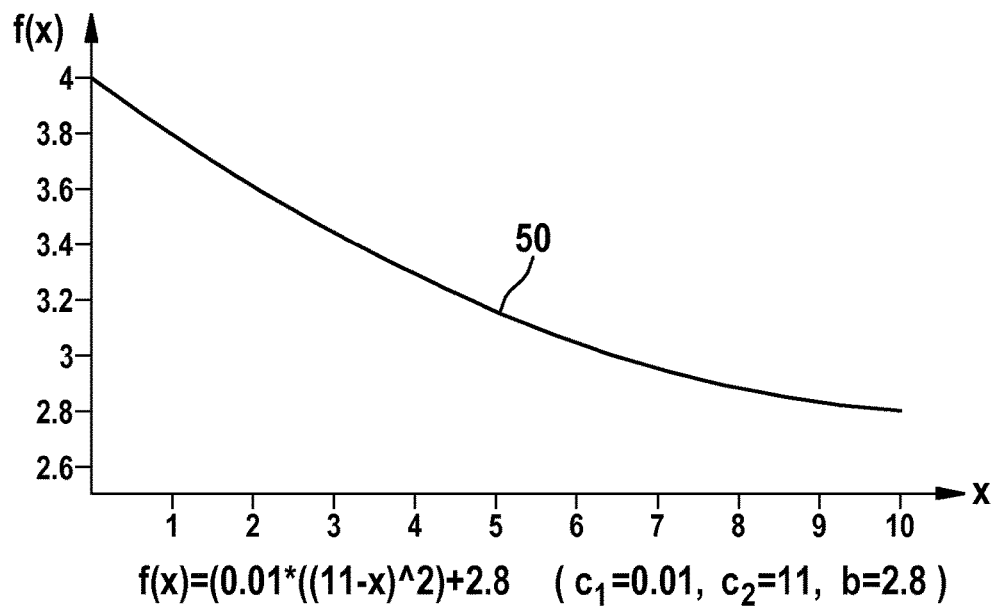

FIGS. 3A, 3B and 3C show exemplary characteristic functions 46, 48, 50, 52, 54, 56, 58, 60, 62 which approximate a discharging process.

In FIG. 3A, a quadratic function 46 with a negative slope is shown as the characteristic function 46, 48, 50, 52, 54, 56, 58, 60, 62 for a discharging process. As shown, for example, in the interval E3 for the time curve 38 of the cell voltage U in FIG. 2, the cell voltage U decreases less quickly in higher voltage ranges than in lower voltage ranges. Such a discharging process can be approximated with the aid of the quadratic function 46 which is indicated here by way of example by $f(x)=-0.01\cdot(-x^2)+3.5$. The functional parameters $c_1=-0.01$, $c_2=0$ and $b=3.5$ are therefore stored for the quadratic function comprising $f_2(x)=c_1+(c_2+x)^2+b$.

A further option for approximating the discharging process as shown in the interval E3 for the time curve 38 of the cell voltage U in FIG. 2 is depicted in FIG. 3B. In this case, a cubic function 48 is selected as the characteristic function 46, 48, 50, 52, 54, 56, 58, 60, 62 which follows the functional correlation $f(x)=-0.001-x^2+3.5$. In this case, the cubic function 48 has a negative slope. The functional parameters $d_1=-0.001$, $d_2=0$ and $b=3.5$ are therefore stored for the cubic function 46 comprising $f_3(x)=d_1\cdot(d_2+x)^3+b$.

FIG. 3C shows a quadratic function 50 with a negative slope as the characteristic function 46, 48, 50, 52, 54, 56, 58, 60, 62. As is shown, for example, in the interval E1 for the time curve 38 of the cell voltage U in FIG. 2, the cell voltage U decreases more quickly in higher voltage ranges than in lower voltage ranges. Such a discharging process can be approximated with the aid of the quadratic function 50, which is indicated by $f(x)=0.01\cdot(11-x)^2+2.8$. The functional parameters $c_1=0.01$, $c_2=11$ and $b=2.8$ are therefore stored for the function 50 comprising $f_2(x)=c_1\cdot(c_2-x)^2+b$.

The characteristic functions 46, 48, 50, 52, 54, 56, 58, 60, 62 shown in FIGS. 3A, 3B, 3C are only exemplary functions for approximating the time curve 38 of the discharging process. Depending on the actually detected time curve 38, different polynomials with different functional parameters are possible as the characteristic function 46, 48, 50, 52, 54, 56, 58, 60, 62.

Analogous to the characteristic functions 46, 48, 50, 52, 54, 56, 58, 60, 62 exemplarily depicted for the discharging process, the charging process can likewise be approximated with the aid of polynomials as the characteristic function 46, 48, 50, 52, 54, 56, 58, 60, 62. These have a positive slope such as, for example, in the intervals L2 and L4 from the time curve 38 in FIG. 2. The characteristic functions 46, 48, 50, 52, 54, 56, 58, 60, 62 for the charging process can also follow a polynomial, such as a quadratic or cubic function 56, 62 with a positive slope.

FIG. 4 shows an exemplary time curve 38 of a cell voltage U during a driving cycle FZ, which is divided up into charging processes and discharging processes and is approximated by characteristic functions 46, 48, 50, 52, 54, 56, 58, 60, 62.

The time curve 38 and the division into charging processes and discharging processes correspond to FIG. 2. Besides the extreme points 40, the characteristic functions 46, 48, 50, 52, 54, 56, 58, 60, 62 are additionally depicted for the individual intervals E1, L2, E3 and L4. A discharging process is present in the interval E1, said discharging process being approximated by the quadratic function 50 which is shown in FIG. 3C and comprises adapted functional parameters as the characteristic function 46, 48, 50, 52, 54, 56, 58, 60, 62. The charging process is approximated by the linear function 52 comprising adapted functional parameters as the characteristic function 46, 48, 50, 52, 54, 56, 58, 60, 62 in the intervals L2 and L4. The discharging process in the interval E4 is approximated by the cubic function 48 which is shown in FIG. 3B and comprises adapted functional parameters as the characteristic function 46, 48, 50, 52, 54, 56, 58, 60, 62.

The characteristic functions 46, 48, 50, 52, 54, 56, 58, 60, 62, comprising the functional parameters thereof, and the extreme points 40 are stored in the non-volatile storage unit 32 as usage data.

FIGS. 5A and 5B schematically depict an exemplary set of characteristic functions 46, 48, 50, 52, 54, 56, 58, 60, 62, which are deposited in a non-volatile storage unit 32, and an exemplary enhancement of the set of characteristic functions 46, 48, 50, 52, 54, 56, 58, 60, 62.

In the example of FIG. 5A, four characteristic functions 46, 48, 50, 52, 54, 56, 58, 60, 62 are deposited in the non-volatile storage unit 32, a linear function 54 with negative slope for discharging processes, a quadratic function 50 with negative slope for discharging processes, a cubic function 48 with negative slope for discharging processes, a linear function 52 with positive slope for charging processes and a quadratic function 56 with positive slope for charging processes. If it is determined during the service life of the battery 16 that other characteristic functions 46, 48, 50, 52, 54, 56, 58, 60, 62 better approximate the charging processes and discharging processes, for example in an age or usage related manner, further characteristic functions 46, 48, 50, 52, 54, 56, 58, 60, 62 are deposited in the non-volatile storage unit 32. In the example of FIG. 5B, three further characteristic functions are deposited, for example, by means of a software update. These are a further cubic function 58 with negative slope for approximating the discharging process, a further cubic function 60 for approximating the discharging process and a cubic function 62 with positive slope for approximating the charging process.

The invention is not limited to the exemplary embodiments and the aspects emphasized therein. A multiplicity of modifications, which lie within the scope of actions taken by a person skilled in the art, is in fact possible within the range specified by the claims.

The invention claimed is:

1. A method for monitoring a battery (16) in a vehicle (10), wherein the battery (16) comprises multiple battery cells (19) or multiple groups (20) of battery cells (19), the method comprising:
   a) detecting a time curve (38) of an operating parameter of at least one individual battery cell (19) during a driving cycle (FZ),
   b) ascertaining charging processes and discharging processes in the detected time curve (38) of the operating parameter,
   c) ascertaining a use parameter set that characterize the charging processes and the discharging processes, wherein the user parameter set includes characteristic functions (46, 48, 50, 52, 54, 56, 58, 60, 62) that characterize the individual charging processes and discharging processes, the functional parameters of the characteristic functions, and extreme points in the time curve of the operating parameter, wherein the ascertained charging processes and discharging processes are reconstructed using the characterizing functions and the functional parameters, and
   d) storing the ascertained use parameter set in a non-volatile storage unit (32).

2. The method according to claim 1, wherein one or multiple characteristic functions (46, 48, 50, 52, 54, 56, 58, 60, 62) are predefined.

3. The method according to claim 1, wherein the number of the characteristic functions (46, 48, 50, 52, 54, 56, 58, 60, 62) which are predefined is expanded or reduced on the basis of previously detected time curves (38).

4. The method according to claim 1, wherein the characteristic functions (46, 48, 50, 52, 54, 56, 58, 60, 62) comprise polynomials up to a sixth order.

5. The method according to claim 1, wherein the extreme points (40) of individual charging processes and discharging processes are used to reconstruct the starting point in time, the end point in time and the duration of individual charging processes or discharging processes.

6. The method according to claim 1, wherein the use parameter set is stored for each charging process and discharging process during the service life of the battery (16).

7. The method according to claim 1, wherein the time curve (38) of the operating parameter is reconstructed from the stored use parameters in an additional step.

8. The method according to claim 7, wherein the reconstructed time curve (38) is evaluated in relation to a use of the battery (16) in at least one past driving cycle (FZ).

9. A computer program which carries out a method according to claim 1 if the computer program is executed on programmable computer equipment.

10. The method of claim 1, wherein ascertaining the charging processes and discharging processes includes ascertaining the charging processes and discharging processes using a slope profile in the time curve of the operating parameter.

11. A battery system (12) for monitoring a battery (16) of a vehicle (10), wherein the battery (16) comprises multiple battery cells (19) or groups (20) of battery cells (19), the battery system comprising:
 a) a sensor unit (22, 23) for detecting a time curve (38) of an operating parameter of at least one individual battery cell (19) during a driving cycle (FZ),
 b) a unit (28) for ascertaining charging processes and discharging processes in the detected time curve (38) of the operating parameter,
 c) a unit (30) for ascertaining a use parameter set that characterize the charging processes and the discharging processes, wherein the user parameter set includes characteristic functions (46, 48, 50, 52, 54, 56, 58, 60, 62) that characterize the individual charging processes and discharging processes, the functional parameters of the characteristic functions, and extreme points in the time curve of the operating parameter, wherein the ascertained charging processes and discharging processes are reconstructed using the characterizing functions and the functional parameters, and
 d) a non-volatile storage unit (32) for storing the ascertained use parameter set.

12. A vehicle (10) comprising a battery system (12) according to claim 11.

13. The battery system of claim 11, wherein the driving cycle is a period of time between starting the vehicle from an inactive state and a subsequent renewed transfer of the vehicle into the inactive state.

* * * * *